(12) United States Patent
Kato

(10) Patent No.: US 8,634,266 B2
(45) Date of Patent: Jan. 21, 2014

(54) SEMICONDUCTOR DEVICE

(75) Inventor: Kiyoshi Kato, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/613,428

(22) Filed: Sep. 13, 2012

(65) Prior Publication Data

US 2013/0016579 A1 Jan. 17, 2013

Related U.S. Application Data

(60) Continuation of application No. 12/699,083, filed on Feb. 3, 2010, now Pat. No. 8,284,625, which is a division of application No. 10/585,571, filed as application No. PCT/JP2005/001288 on Jan. 24, 2005, now Pat. No. 7,707,442.

(30) Foreign Application Priority Data

Jan. 30, 2004 (JP) ................................. 2004-024819
Jan. 30, 2004 (JP) ................................. 2004-024822

(51) Int. Cl.
*G11C 5/14* (2006.01)

(52) U.S. Cl.
USPC .......................................... 365/226; 365/227

(58) Field of Classification Search
USPC .................. 365/226, 227, 229; 713/324, 103; 235/492
See application file for complete search history.

(56) References Cited

U.S. PATENT DOCUMENTS

| | | | |
|---|---|---|---|
| 5,093,809 A | 3/1992 | Schmitt-Landsiedel et al. |
| 5,594,360 A | 1/1997 | Wojciechowski |
| 5,801,372 A | 9/1998 | Yamaguchi |
| 5,887,176 A | 3/1999 | Griffith et al. |
| 6,029,006 A | 2/2000 | Alexander et al. |

(Continued)

FOREIGN PATENT DOCUMENTS

| | | |
|---|---|---|
| EP | 0 851 336 | 7/1998 |
| EP | 0 851 336 A | 7/1998 |

(Continued)

OTHER PUBLICATIONS

International Search Report (Application No. PCT/JP2005/001288) dated Mar. 15, 2005.

(Continued)

*Primary Examiner* — Vu Le

(74) *Attorney, Agent, or Firm* — Eric J. Robinson; Robinson Intellectual Property Law Office, P.C.

(57) ABSTRACT

A semiconductor device capable of stabilizing power supply by suppressing power consumption as much as possible. The semiconductor device of the invention includes a central processing unit having a plurality of units and a control circuit, and an antenna. The control circuit includes a means for outputting, based on a power supply signal including data on power supply from an antenna (through an antenna) or a load signal obtained by an event signal supplied from each of the units, one or more of a first control signal for stopping power supply to one or more of the units, a second control signal for varying a power supply potential supplied to one or more of the units, and a third control signal for stopping supplying a clock signal to one or more of the units.

20 Claims, 12 Drawing Sheets

(56) References Cited

U.S. PATENT DOCUMENTS

| | | | |
|---|---|---|---|
| 6,031,781 | A | 2/2000 | Tsuji et al. |
| 6,038,186 | A | 3/2000 | Tanizaki |
| 6,434,080 | B1 | 8/2002 | Shiga |
| 6,498,396 | B1 | 12/2002 | Arimoto |
| 6,590,813 | B2 | 7/2003 | Shiga |
| 6,657,911 | B2 | 12/2003 | Yamaoka et al. |
| 6,784,813 | B2 | 8/2004 | Shanks et al. |
| 6,826,705 | B2 | 11/2004 | Tani |
| 6,914,803 | B2 | 7/2005 | Yamaoka et al. |
| 7,099,183 | B2 | 8/2006 | Yamaoka et al. |
| 7,272,068 | B2 | 9/2007 | Yamaoka et al. |
| 7,287,115 | B2 | 10/2007 | Otani et al. |
| 7,474,584 | B2 | 1/2009 | Yamaoka et al. |
| 7,584,367 | B2 | 9/2009 | Tani |
| 7,646,662 | B2 | 1/2010 | Yamaoka et al. |
| 7,961,545 | B2 | 6/2011 | Yamaoka et al. |
| 8,035,233 | B2 | 10/2011 | Leedy |
| 2002/0114204 | A1 | 8/2002 | Thijs et al. |
| 2003/0098875 | A1 | 5/2003 | Kurokawa et al. |
| 2003/0103025 | A1 | 6/2003 | Kurokawa et al. |
| 2005/0091550 | A1 | 4/2005 | Tani |
| 2011/0006735 | A1* | 1/2011 | Wu et al. ............... 320/125 |
| 2011/0216579 | A1 | 9/2011 | Yamaoka et al. |
| 2011/0216610 | A1* | 9/2011 | Maeda ............... 365/189.16 |

FOREIGN PATENT DOCUMENTS

| | | |
|---|---|---|
| JP | 5-019917 | 1/1993 |
| JP | 10-198564 | 7/1998 |
| JP | 10-199253 | 7/1998 |
| JP | 10-199253 A | 7/1998 |
| JP | 11-149779 A | 6/1999 |
| JP | 11-296627 | 10/1999 |
| JP | 11-296627 A | 10/1999 |
| JP | 2000-187977 | 7/2000 |
| JP | 2001-135086 A | 5/2001 |
| JP | 2001-189347 | 7/2001 |
| JP | 2001-189347 A | 7/2001 |
| JP | 2002-026803 | 1/2002 |
| JP | 2002-026803 A | 1/2002 |
| JP | 2002-182807 | 6/2002 |
| JP | 2003-132683 A | 5/2003 |

OTHER PUBLICATIONS

Written Opinion (Application No. PCT/JP2005/001288) dated Mar. 15, 2005.

Korean Office Action (Application No. 2011-7020188) dated Nov. 17, 2011.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Korean Office Action (Application No. 2012-7006797) Dated Jun. 11, 2012.

* cited by examiner

FIG. 5A  peeling
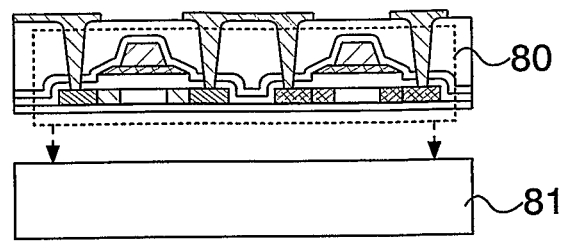
FIG. 5B  attachment
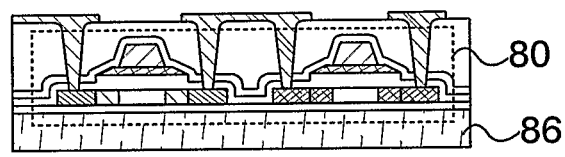
FIG. 5C
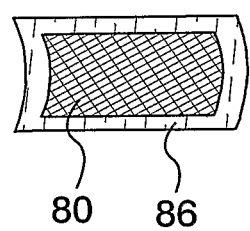
FIG. 5D
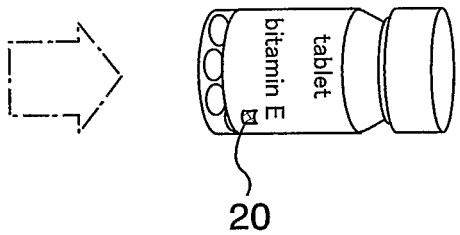

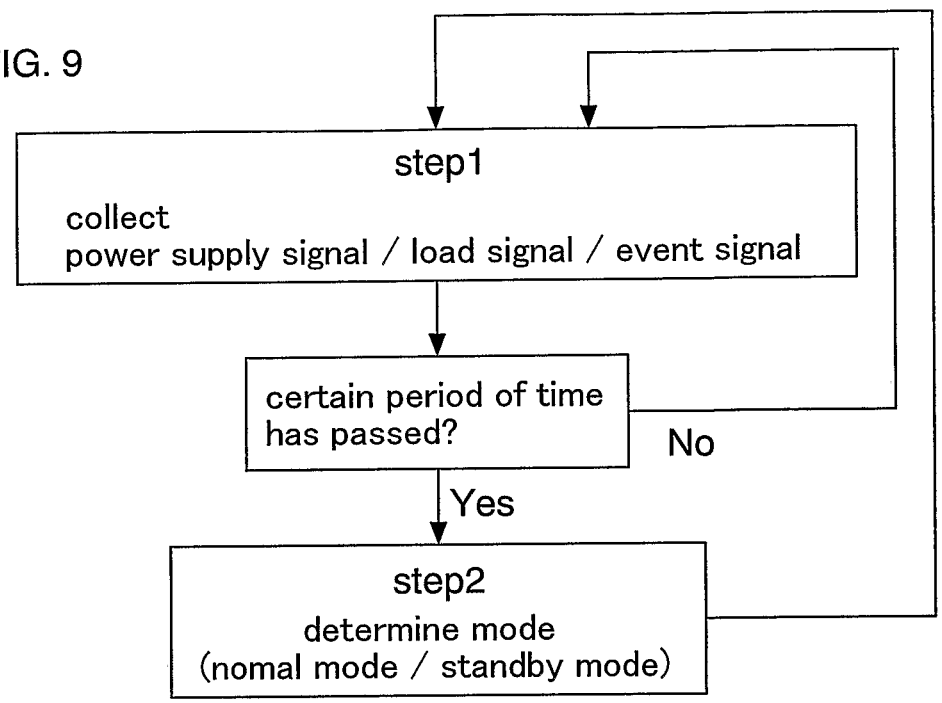

SEMICONDUCTOR DEVICE

TECHNICAL FIELD

The present invention relates to a semiconductor device capable of transmitting and receiving data.

BACKGROUND ART

In recent years, a semiconductor device for transmitting and receiving data has been developed, and such a semiconductor device is called an RF (Radio Frequency) tag, a wireless tag, an electronic tag, or the like. Most of the semiconductor devices that are in practical use have a circuit using a semiconductor substrate (IC chip) and an antenna, though some of them additionally have a CPU or dedicated hardware.

DISCLOSURE OF INVENTION

A wireless tag has difficulty in stabilizing power supply from an antenna, and is needed to suppress power consumption as much as possible. The wireless tag has a function of reading data from a storage medium and performing cryptanalysis, though the latter cryptanalysis requires complex processing, leading to increased power consumption. Strong electromagnetic waves are required with the increase of power consumption, thus there occur problems such as increase in power consumption of a reader/writer and adverse effect on other devices and the human body. Further, the communication distance between the wireless tag and the reader/writer is restricted.

In view of the foregoing, the invention provides a semiconductor device capable of stabilizing power supply by suppressing power consumption as much as possible. That is, the invention provides a semiconductor device capable of maintaining a stable power supply even when complex processing such as cryptanalysis is performed. Further, the invention provides a semiconductor device that does not require strong electromagnetic waves and has improved communication distance from a reader/writer.

In order to solve the aforementioned problems of the conventional technologies, the invention will take the following measures.

A semiconductor device of the invention comprises a central processing unit including a plurality of units and a control circuit, and an antenna. The control circuit comprises a means for outputting, based on a power supply signal including data on power supply from an antenna (through an antenna) or a load signal obtained by an event signal supplied from each of the units, one or more of a first control signal for stopping power supply to one or more of the units, a second control signal for varying a power supply potential supplied to one or more of the units, and a third control signal for stopping supplying a clock signal to one or more of the units.

The plurality of units and the control circuit are provided over a glass substrate or a flexible substrate.

The plurality of units are selected from a bus interface, a data cash, an instruction decoder, a reservation station, an instruction cache, an arithmetic logical unit (ALU), a floating point unit (FPU), a branch unit, a load/store unit, a general purpose register, a pipeline unit, a peripheral memory controller, and a peripheral bus controller.

The semiconductor device of the invention comprises one or more of a power supply circuit, a clock generation circuit, a data demodulation/modulation circuit, a CPU, and an interface circuit.

A semiconductor device of the invention comprises a plurality of memory blocks and a control circuit. Each of the memory blocks comprises a memory cell array including a plurality of memory cells each having a memory element in a region where a bit line and a word line cross each other with an insulator interposed therebetween, and a row decoder connected to the word line. The control circuit comprises a means for outputting, based on an operation signal including operating data of the memory blocks, one or both of a first control signal for varying a power supply potential supplied to the memory cell array and a second control signal for stopping a power supply potential supplied to the row decoder.

The plurality of memory blocks and the control circuit are provided over a glass substrate or a flexible substrate.

The plurality of memory cells included in each of the memory blocks and provided in the same column are connected to the same bit line. The plurality of memory cells included in each of the memory blocks are connected to the same column decoder. Moreover, each of the memory blocks comprises a column decoder operating independently, and the word line is provided independently for each of the memory blocks.

Each of the memory blocks is a DRAM (Dynamic Random Access Memory), an SRAM (Static Random Access Memory), an FRAM (Ferroelectric Random Access Memory), a mask ROM (Read Only Memory), a PROM (Programmable Read Only Memory), an EPROM (Electrically Programmable Read Only Memory), an EEPROM (Electrically Erasable Programmable Read Only Memory), or a flash memory.

The semiconductor device of the invention comprises a CPU or a dedicated circuit for outputting the operation signal. In addition, the semiconductor device of the invention comprises one or more of a power supply circuit, a clock generation circuit, a data demodulation/modulation circuit, a CPU, and an interface circuit.

According to the invention having the aforementioned structures, a semiconductor device capable of stabilizing power supply by achieving low power consumption can be provided. That is, the invention can provide a semiconductor device capable of maintaining a stable power supply even when complex processing such as cryptanalysis is performed. Further, the invention can provide a semiconductor device that does not require strong electromagnetic waves and has improved communication distance from a reader/writer.

BRIEF DESCRIPTION OF DRAWINGS

FIGS. 5A to 5D are diagrams showing a semiconductor device of the invention (Embodiment 1).

FIG. 9 is a diagram showing a semiconductor device of the invention (Embodiment Mode 1).

BEST MODE FOR CARRYING OUT THE INVENTION

Figure 1A:
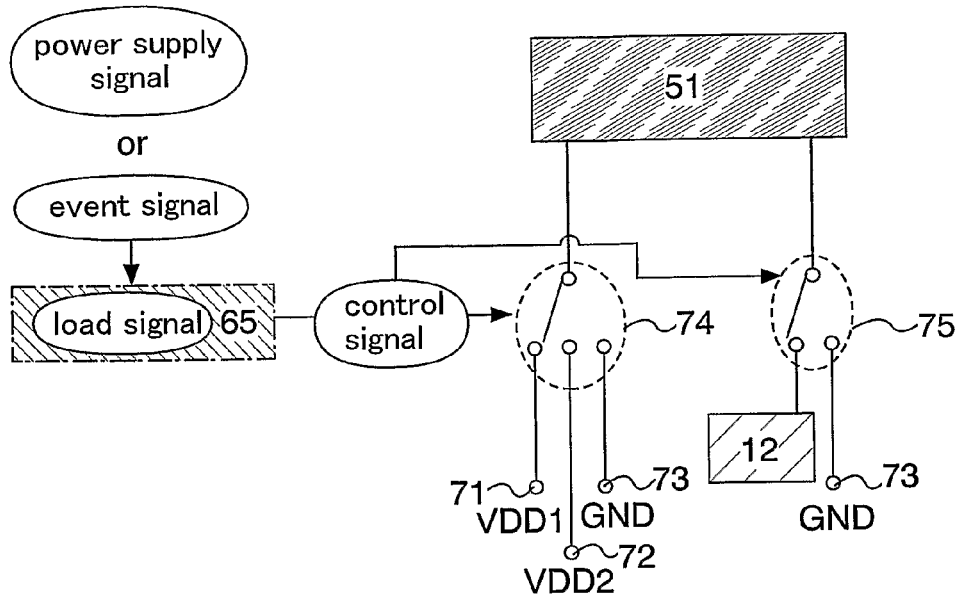
FIGS. 1A and 1B are diagrams showing a semiconductor device of the invention (Embodiment Mode 1).

Although the invention will be described by way of Embodiment Mode with reference to the accompanying drawings, it is to be understood that various changes and modifications will be apparent to those skilled in the art. Therefore, unless such changes and modifications depart from the scope of the invention, they should be construed as being included therein. Note that the identical portions are denoted by the same reference numerals in all the drawings.

Embodiment Mode 1

Figure 3:
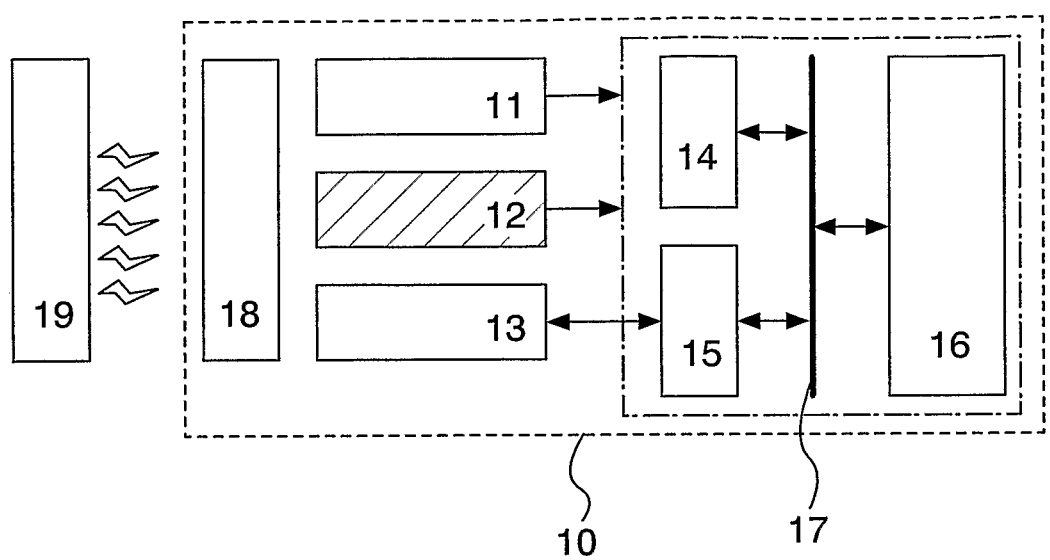
FIG. 3 is a diagram showing a semiconductor device of the invention (Embodiment Mode 1).

A semiconductor device of the invention has a function of communicating data by wireless, and mainly includes a power supply circuit 11, a clock generation circuit 12, a data demodulation/modulation circuit 13, a central processing unit 14 (hereinafter also referred to as a CPU), an interface circuit 15, a memory 16, a data bus 17, an antenna (antenna coil) 18, and the like (see FIG. 3). The power supply circuit 11 generates, based on an AC signal inputted from the antenna 18, various types of power supplies to be supplied to each circuit in the semiconductor device. The clock generation circuit 12 generates, based on an AC signal inputted from the antenna 18, various types of clock signals to be supplied to each circuit in the semiconductor device. The data demodulation/modulation circuit 13 has a function of demodulating/modulating data that is communicated with a reader/writer 19. The antenna 18 has a function of transmitting and receiving electromagnetic waves. The reader/writer 19 communicates with and controls the semiconductor device, and controls data processing thereof. Note that the configuration of the semiconductor device is not limited to the aforementioned one, and various configurations may be adopted. For example, other components such as a power supply voltage limiter circuit and dedicated hardware for cryptanalysis may be additionally provided.

Figure 2A:
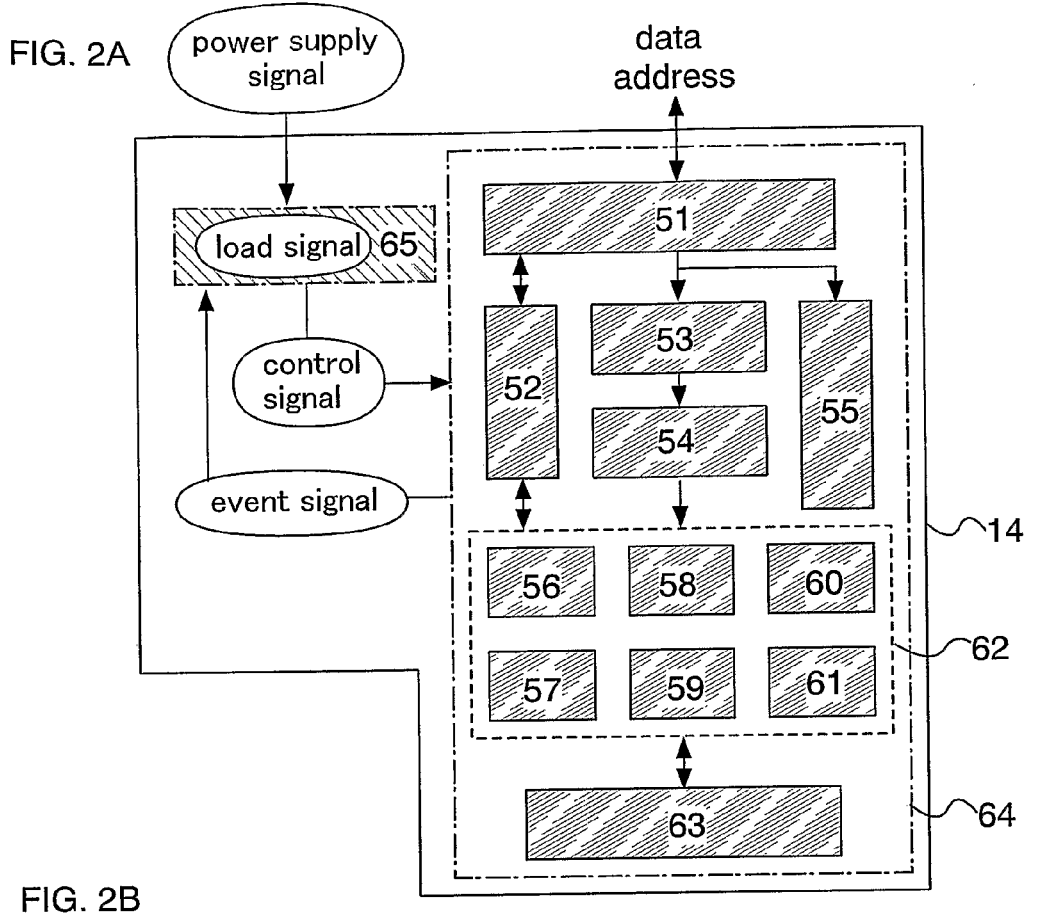
FIGS. 2A and 2B are diagrams showing a semiconductor device of the invention (Embodiment Mode 1).
Figure 2B:
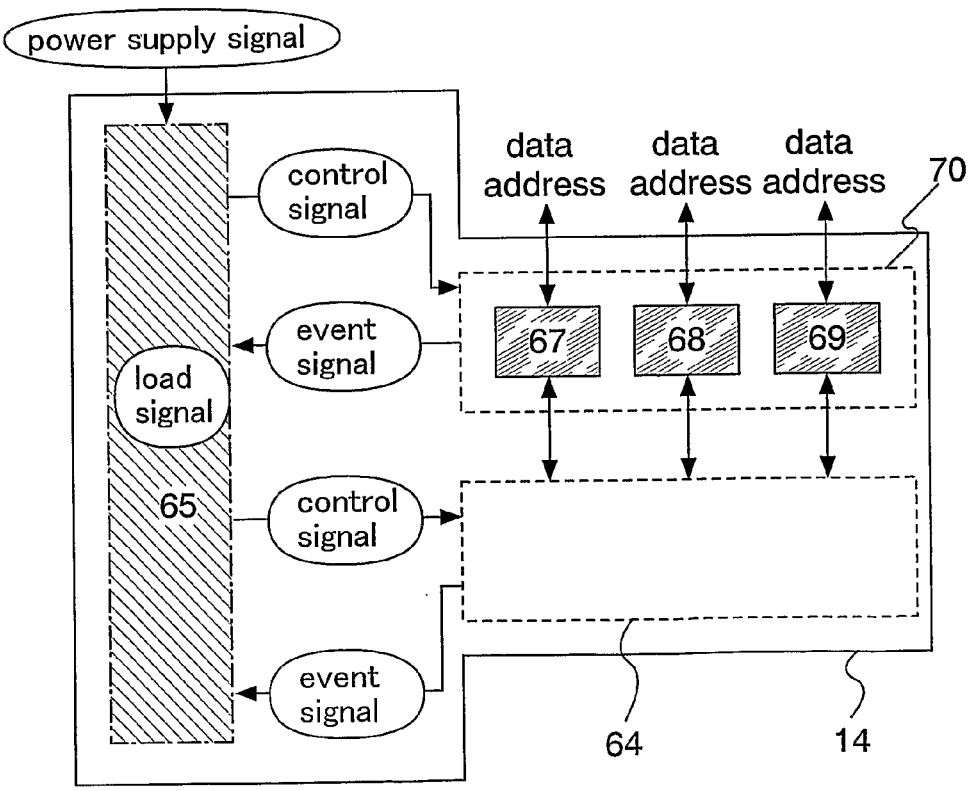

The invention is characterized by the configuration of the CPU 14, which is described below. The CPU 14 includes a CPU core 64 and a control circuit 65 (see FIG. 2A). The CPU core 64 has a plurality of units including, for example, a bus interface 51, a data cache 52, an instruction decoder 53, a reservation station 54, an instruction cache 55, a pipeline unit 62 composed of various units, and a general purpose register 63. The pipeline unit 62 includes arithmetic logical units (hereinafter also referred to as ALUs) 56 and 57, floating point units (hereinafter also referred to as FPUs) 58 and 59, a branch unit 60, and a load/store unit 61. Such a configuration of the CPU core 64 is a typical configuration of a superscalar chip. As another configuration of the CPU 14, for example, the CPU core 64, the control circuit 65 and the peripheral controller 70 may be provided. The peripheral controller 70 has a plurality of units including, for example, peripheral memory controllers 67 and 68 and a peripheral bus controller 69 (see FIG. 2B). Note that the configuration of the CPU 14 is not limited to the aforementioned one, and unnecessary components may be omitted or other components may be added as needed.

The aforementioned unit X (X=51 to 63, herein 51) is connected to power supplies 71 to 73 through a switch 74 (see FIG. 1A). A power supply potential of the power supply 71 (hereinafter also referred to as a first power supply potential or a VDD1), a power supply potential of the power supply 72 (hereinafter also referred to as a second power supply potential or a VDD2), and a power supply potential of the power supply 73 (hereinafter also referred to as a third power supply potential or a GND) are set to satisfy VDD1>VDD2>GND. The switch 74 is controlled by a control signal supplied from the control circuit 65.

In addition, the unit X is connected to the clock generation circuit 12 and the power supply 73 through a switch 75. The switch 75 is controlled by a control signal supplied from the control circuit 65.

Note that power supply potentials of the power supplies 71 to 73 may be either power supply potentials generated in the power supply circuit 11 or power supply potentials generated in a power supply circuit provided in the CPU 14.

The control circuit 65 has a means (function) of supplying a control signal based on a power supply signal inputted from the power supply circuit 11 or a load signal obtained by an event signal supplied from each unit of the CPU core 64. The control circuit 65 changes the setting of power supply potentials and clock signals, namely changes the mode (normal mode or standby mode) in order to achieve low power consumption. When only the setting of power supply potentials and clock signals are changed, however, the operation of the entire CPU 14 may be effected. Thus, the operation for changing the mode means various types of settings as well as controls of the switches 74 and 75.

In the normal mode, the unit X is electrically connected to the power supply 71 through the switch 74 and electrically connected to the clock generation circuit 12 through the switch 75. In other words, the VDD1 and a clock signal are supplied to the unit X. Such a state is referred to as (VDD1, CLK).

In the standby mode, the unit X is: (1) electrically connected to the power supply 71 through the switch 74 and electrically connected to the power supply 73 through the switch 75 (VDD1, GND); (2) electrically connected to the power supply 72 through the switch 74 and electrically connected to the clock generation circuit 12 through the switch 75 (VDD2, CLK); (3) electrically connected to the power supply 72 through the switch 74 and electrically connected to the power supply 73 through the switch 75 (VDD2, GND); (4) electrically connected to the power supply 73 through the switch 74 and electrically connected to the clock generation circuit 12 through the switch 75 (GND, CLK); or (5) electrically connected to the power supply 73 through the switch 74 and electrically connected to the power supply 73 through the switch 75 (GND, GND).

The case where the unit X is electrically connected to the power supply 73 through the switch 74, that is the case of (4) or (5) can be adopted only when the state of the unit X is not required to be held in the unit X itself. Accordingly, when the operation is not expected to return to the initial state, one of the cases (1) to (3) is adopted to supply the VDD1 or the VDD2 to the unit X. In the case of (2) or (3) where the VDD2 is supplied, a value of a register that stores the setting of the unit X can be held in the unit X. Therefore, when the standby mode is changed to the normal mode, the operation cannot return to the initial state but the state before switching to the standby mode.

A power supply signal inputted to the control circuit 65 includes data on power supply from the antenna 18, and more specifically, it includes data on whether power supply from the antenna 18 is stable or unstable.

A load signal is generated in the control circuit 65 depending on the result of counting an event signal. An event signal is supplied from each of the units, and includes for example an event signal operated in the ALUs 56 and 57, an event signal operated in the FPUs 58 and 59, an event signal of an instruction cache miss or a data cache miss, and the like. The control circuit 65 counts an event signal periodically, and depending on the result thereof, it generates internally a load signal of the ALUs 56 and 57, a load signal of the FPUs 58 and 59, and a load signal including data on cache efficiency or the like. Then, the control circuit 65 changes the mode of the unit X in accordance with the load signal. More specifically, when a load signal including data indicating a low load or efficiency is generated, the control circuit 65 outputs a control signal for setting the unit X to the standby mode. Meanwhile, when a load signal including data indicating a normal load or efficiency is generated, the control circuit 65 outputs a control signal for setting the unit X to the normal mode.

For example, if a load signal including data indicating a low load to the ALUs 56 and 57 is generated as the result of counting an event signal in a certain period, only the ALU 56 is set to the operation mode while the ALU 57 is set to the standby mode. The CPU 14 is set so that operation using the ALU 57 is not performed when the ALU 57 is in the standby mode. More specifically, the setting for not using the ALU 57 may be performed in the reservation station 54 that performs instruction scheduling. Meanwhile, if a load signal including data indicating a high load to the ALU 56 is generated as the result of counting an event signal in another period, the ALU 57 returns to the normal mode.

Alternatively, if a load signal including data indicating a low load to the branch unit 60 is generated as the result of counting an event signal in a certain period, the branch unit 60 is set to the standby mode. When a branch instruction is executed during a period where the branch unit 60 is in the standby mode, however, exception handling is performed to return the branch unit 60 to the normal mode.

As described above, a unit set to the standby mode is a unit X of which use is limited to certain instructions (e.g., a branch unit used at branch instruction execution only), or a unit X that is not required for the normal operation of a CPU (e.g., a cache in the case where the CPU 14 does not use the cache). The unit of which use is limited to certain instructions is, for example, one or more of pipeline units, a peripheral memory control unit, or a bus interface unit. If an unused unit is accessed in the standby mode depending on an instruction, exception handling may be performed to return the unit to the normal mode and the instruction is executed thereafter.

The unit X having an unused operating mode includes a cache memory, parallel pipeline units in a superscalar, and the like. When the standby mode is set, the cache memory or one or more of the pipeline units may be set in advance so as not to be used. When the cache is set to the standby mode, the configuration where a cache miss occurs during each cache access may be adopted. When one or more of the pipeline units are set to a used operating mode, the reservation station 54 may be utilized so as to perform instruction scheduling with only an instruction for using the selected pipeline unit.

The foregoing is summarized as follows. The control circuit 65 to which is inputted a power supply signal or a load signal for setting the unit X to the normal mode outputs a control signal for setting the unit X to (VDD1, GND) based on such a signal. On the other hand, the control circuit 65 to which is inputted a power supply signal, or a load signal for setting the unit X to the standby mode outputs a control signal for setting the unit X to one of (VDD1, GND), (VDD2, CLK), (VDD2, GND), (GND, CLK), and (GND, GND) based on such a signal. In this specification, a control signal for stopping power supply to one or more of the units is referred to as a first control signal, a control signal for varying a power supply potential supplied to one or more of the units is referred to as a second control signal, and a control signal for stopping supplying a clock signal to one or more of the units is referred to as a third control signal.

Figure 1B:
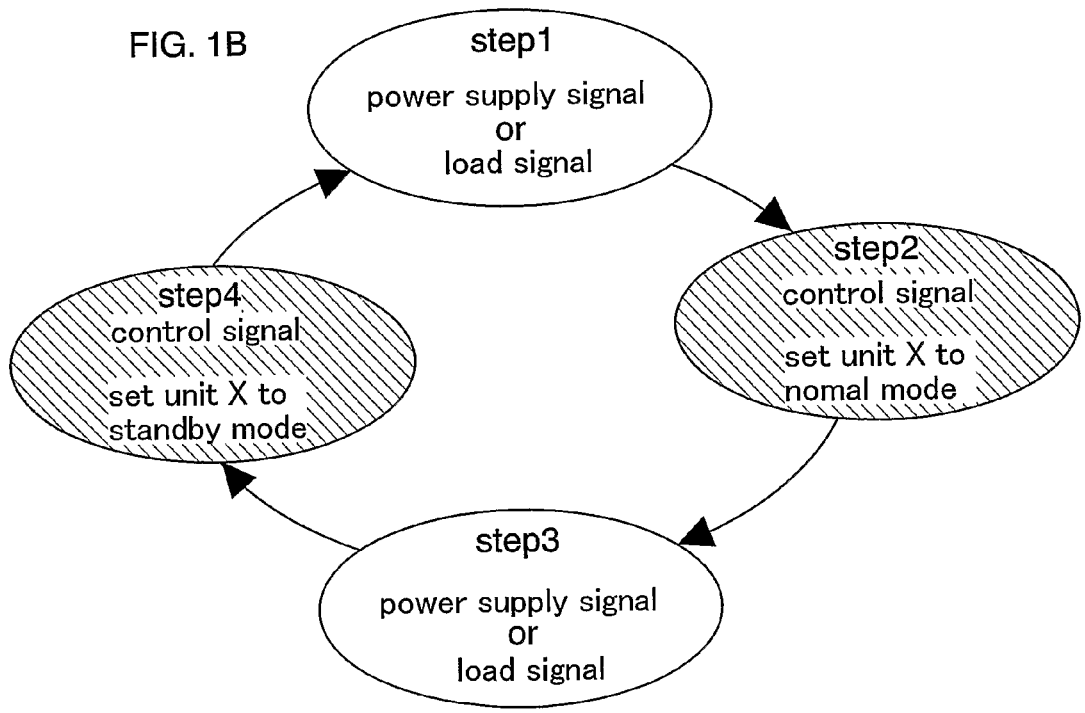

That is, the operation of the CPU 14 with the aforementioned configuration can be shown as a chart of FIG. 1B. First, a power supply signal or a load signal is inputted to the control circuit 65 (step 1). It is assumed herein that a power supply signal including data indicating a stable power supply or a load signal including data indicating a normal load is inputted. Then, the control circuit 65 outputs a control signal for setting the unit X to the normal mode (step 2).

Subsequently, another power supply signal or another load signal is inputted to the control circuit 65 (step 3). It is assumed herein that a power supply signal including data indicating an unstable power supply or a load signal including data indicating a high load of the unit X is inputted. Then, the control circuit 65 outputs a signal for setting the unit X to the standby mode (step 4). Afterwards, the operation returns to the step 1 and the steps 1 to 4 are repeated.

In this embodiment mode, an optimum power supply potential is selected from a plurality of power supply potentials by controlling the switch 74 disposed between the unit X and the power supplies 71 to 73, thereby the mode (normal mode or standby mode) is changed. However, the invention is not limited to this.

For example, an optimum power supply potential may be selected from a plurality of power supply potentials by controlling the power supply circuit 11. According to this method, a plurality of power supply potentials are generated by resistance division in the power supply circuit 11, and the power supply potentials are amplified by an analog buffer and stabilized by a capacitor element, thereby a plurality of power supply potentials are outputted. However, this method requires a controlling switch and a capacitor element, leading to increased circuit area due to such elements. Thus, in order to suppress the increase in circuit area, another method may be adopted in which a plurality of power supply potentials are generated by resistance division in the power supply circuit 11, an optimum power supply potential is selected from the power supply potentials, and the optimum power supply potential is amplified and stabilized, thereby a plurality of power supply potentials are outputted.

Although the mode (normal mode or standby mode) is changed by controlling the switch 75 provided between the unit X and the clock generation circuit 12 in this embodiment mode, the invention is not limited to this. The mode may be changed by controlling the clock generation circuit 12.

Although the control circuit 65 changes the mode (normal mode or standby mode) based on a power supply signal or a load signal in this embodiment mode, the invention is not limited to this.

The mode is changed by a power supply signal or a load signal as shown above, but the mode is not necessarily changed by the control circuit 65 in accordance with such a signal. Instead, such a signal (a power supply signal, a load signal or an event signal) may be collected by the control circuit 65 for a certain period to change the mode based on the result thereof. Such an operation is described with reference to FIG. 9.

First, a power supply signal, a load signal or an event signal is collected by the control circuit 65 (step 1). After a certain period of time (e.g., 1000 to 10000 cycles), the mode is determined in accordance with the signals collected for the period (step 2). When the mode is determined, a unit for changing the mode is selected to change the mode of the unit. Then, the operation returns to the step 1 and the aforementioned steps are repeated.

For example, described below is the case where the mode is changed based on an event signal, provided that the event signal is an event where integer arithmetic is performed using a specific ALU.

First, an event signal where a specific ALU performs integer arithmetic is counted (step 1). After a certain period of time, the counted value is compared with a predetermined setting value to determine the mode (step 2). More specifically, when the counted value is equal to or less than a predetermined setting value, the standby mode is selected, whereas when the counted value is equal to or more than a predetermined setting value, the normal mode is selected. Then, a specific ALU is changed to the selected mode.

As another example, description is made on the case where the mode is changed based on a power supply signal with four levels. First, a power supply signal with four levels is collected (step 1). After a certain period of time, an average of the levels is calculated and the mode is determined in accordance with the result (step 2).

For example, if the average is four, all of the units are set to the normal mode. If the average is three, one or more of the units are set to the standby mode. At this time, for example, one of the ALUs or one of the FPUs is set to the standby mode. If the average is two, for example an instruction cache and a data cache are set to the standby mode in addition to the units set to the standby mode when the average is three. If the average is one, necessary data is stored in a nonvolatile memory to turn off the power.

The invention is characterized by changing the mode based on a power supply signal or a load signal. Next, the configuration and the operation of a power supply signal generation circuit for generating a power supply signal are described with reference to FIG. 10.

A power supply signal generation circuit includes power supply generation circuits 601 and 602, a resistor element 603, a reference potential generation circuit 604, and a comparator circuit 605. The power supply generation circuits 601 and 602 are connected to the antenna 18. Each of the power supply generation circuits 601 and 602 includes a diode and a capacitor, and has a function of generating a plurality of power supply potentials. The power supply generation circuit 602 has enough power supply capacity to achieve constant operation even when the antenna 18 has a low power supply level. The reference potential generation circuit 604 includes a resistor and a buffer, and has a function of generating a reference potential (hereinafter also referred to as Vref) by resistance division, amplifying it by an analog buffer and outputting. The comparator circuit 605 includes a differential amplifier and has a function of comparing two analog potentials.

Power supply potentials generated from the power supply generation circuit 602 and a ground potential (GND) are voltage-dropped by the resistor element 603 to generate potentials V1 to Vn. The comparator circuit 605 compares the potentials V1 to Vn with the reference potential Vref, thereby a power supply signal (digital signal) including data on a power supply level is generated.

The potentials V1 to Vn are analog potentials determined by the power supply capacity of the power supply generation circuit 602 and the current consumption of the resistor element 603. Provided that n=3 is satisfied, for example, and a parameter of each circuit is arbitrarily selected so as to satisfy V1>V2>V3, then the power supply level is indicated by four-level power supply signals (1, 1, 1), (1, 1, 0), (1, 0, 0), and (0, 0, 0) sequentially from high to low.

In other words, when the power supply level from the antenna 18 is high, voltage drop by the resistor element 603 is low and the potentials V1 to V3 are all higher than the Vref, thereby the signal (1, 1, 1) is outputted. On the other hand, when the power supply level from the antenna 18 is low, voltage drop by the resistor element 603 is high and the potentials V1 to V3 are all lower than the Vref, thereby the signal (0, 0, 0) is outputted.

Figure 10:
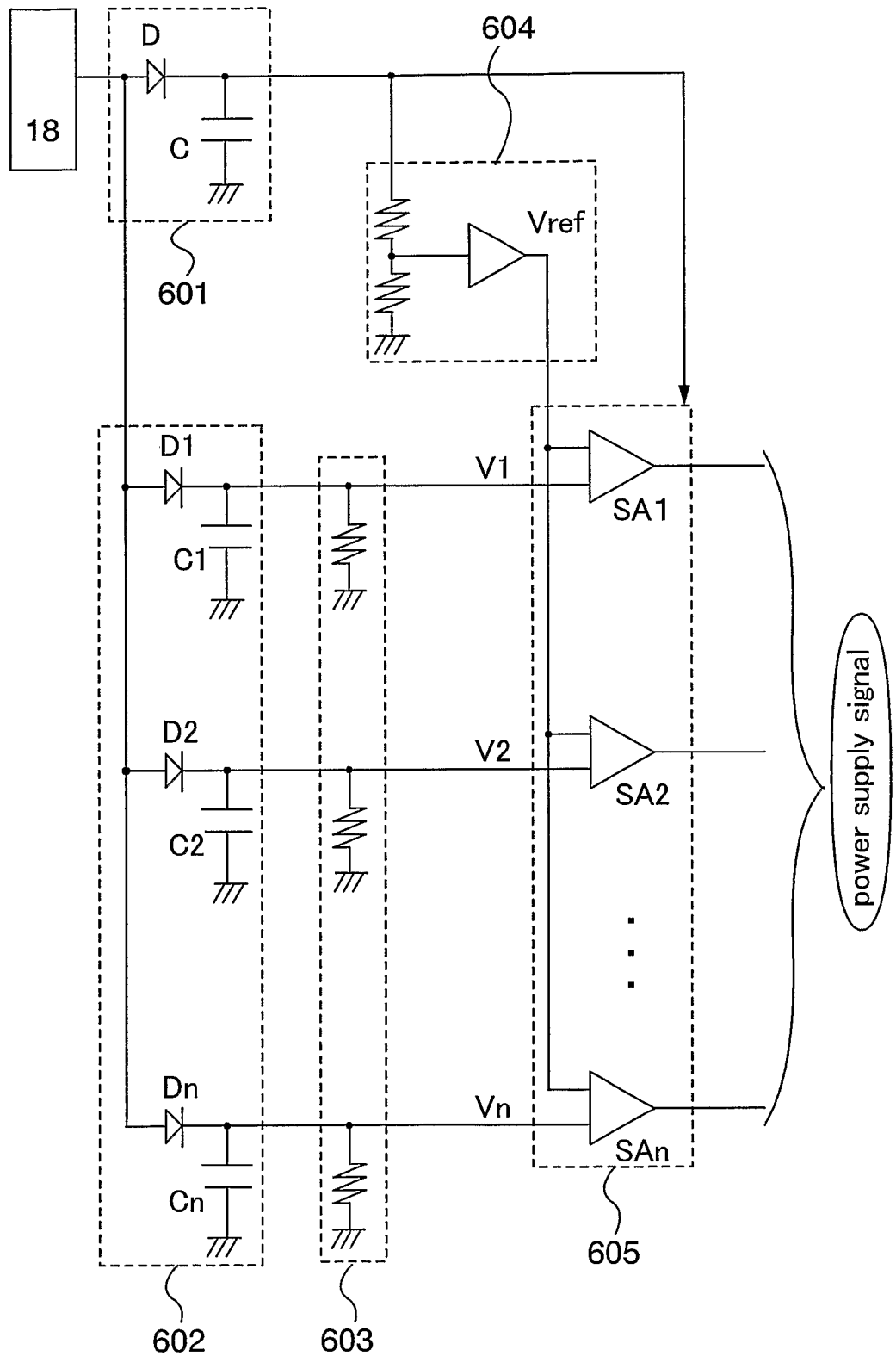
FIG. 10 is a diagram showing a semiconductor device of the invention (Embodiment Mode 1).

The configuration of the power supply signal generation circuit is not limited to the one shown in FIG. 10, and known configurations of the power supply generation circuit, the potential generation circuit and the comparator circuit may be adopted as well. In addition, although one reference potential is compared with a plurality of potentials V1 to Vn in the aforementioned configuration, the invention is not limited to this. For example, a plurality of reference potentials may be generated and compared with a voltage-dropped potential V to determine the power supply level.

According to the invention having the aforementioned configuration, the mode is changed based on a power supply signal, thereby power consumption can be optimized in accordance with the power supply from the antenna. Further, according to the invention, the mode is changed based on a load signal determined by an event signal, thereby power consumption can be optimized in accordance with the operation of a CPU. Therefore, the invention can provide a semiconductor device with an improved operating margin with respect to the power supply.

Embodiment Mode 2

Figure 12:
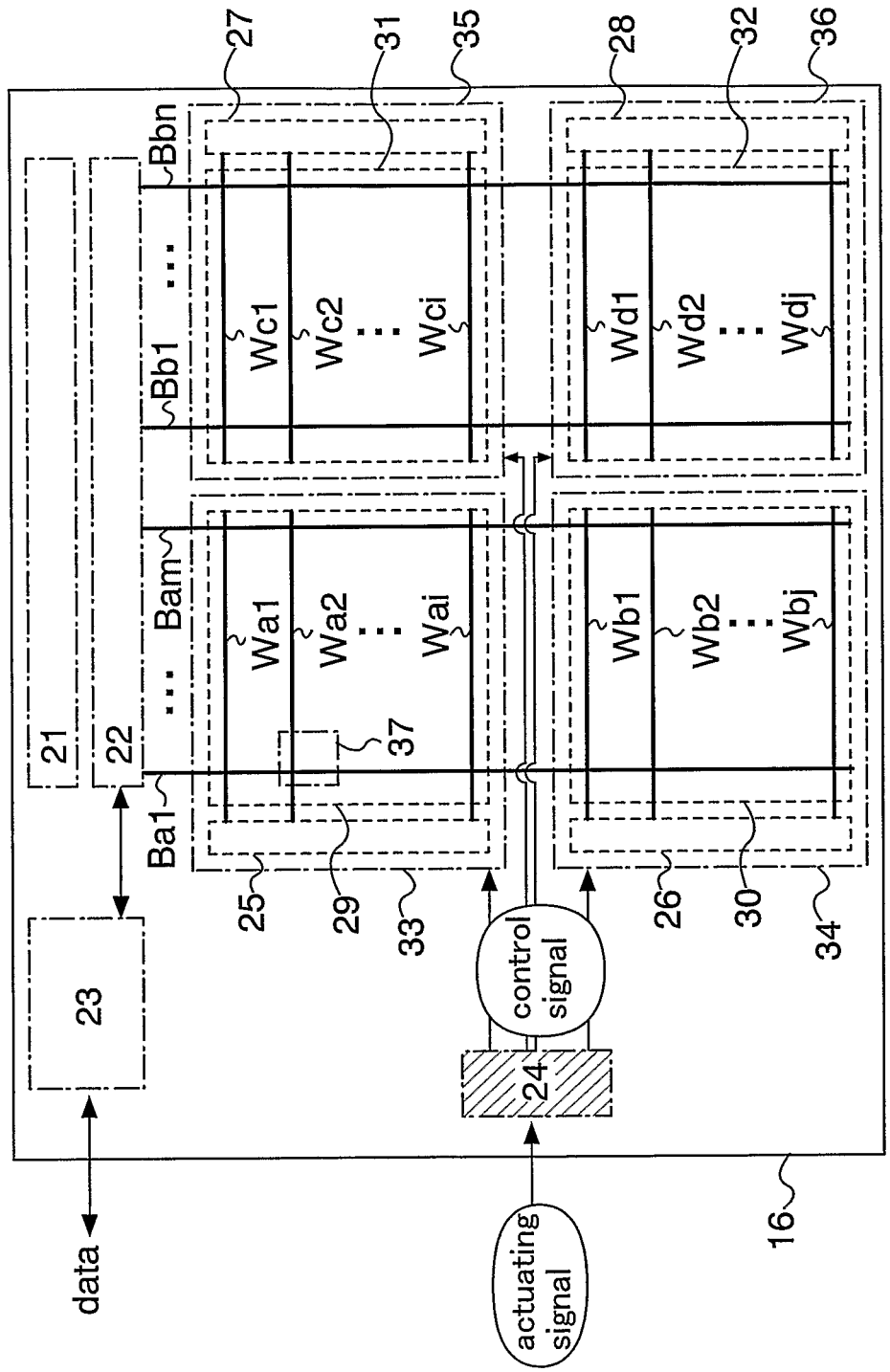
FIG. 12 is a diagram showing a semiconductor device of the invention (Embodiment Mode 2).

Described next is a configuration of a semiconductor device characterized by a configuration of the memory 16. Thus, a configuration of the memory 16 is described hereinafter. The memory 16 includes a plurality of (four herein) memory blocks 33 to 36, a column decoder 21, a selector 22, a read/write circuit 23 for inputting and outputting (writing and reading) data, and a control circuit 24 that operates in accordance with an operation signal (see FIG. 12).

The memory block 33 includes a memory cell array 29 and a row decoder 25, the memory block 34 includes a memory cell array 30 and a row decoder 26, the memory block 35 includes a memory cell array 31 and a row decoder 27, and the memory block 36 includes a memory cell array 32 and a row decoder 28. The memory cell array 29 includes bit lines Ba1 to Bam (m is a natural number) and word lines Wa1 to Wai (i is a natural number), the memory cell array 30 includes the bit lines Ba1 to Bam and word lines Wb1 to Wbj (j is a natural number), the memory cell array 31 includes bit lines Bb1 to Bbn (n is a natural number) and word lines Wc1 to Wci, and the memory cell array 32 includes the bit lines Bb1 to Bbn and word lines Wd1 to Wdj.

Each of the memory cell arrays 29 to 32 includes a plurality of memory cells 37 each of which has a memory element in a region where a bit line Bax (1=x=m) and a word line Way or Wby (1=y=i), or a bit line Bbx (1=x=n) and a word line Wcy or Wdy (1=y=j) cross each other with an insulator interposed therebetween.

The memory element corresponds to one or more of a transistor, a capacitor element and a resistor element. In the case of an SRAM, the memory element may be configured by six transistors, five transistors, four transistors and two resistor elements, or four transistors and one resistor element. If the memory element is configured by six transistors, or four transistors and two resistor elements, two bit lines (one bit line and one bit bar line) are disposed in each column. Meanwhile, in the case of a flash memory, the memory element corresponds to a transistor including a charge accumulation layer. The memory 16 can thus be a DRAM, an FeRAM, an OUM, an MRAM, a mask ROM, a PRAM, an EPROM, an EEPROM and the like as well as an SRAM and a flash memory. Note that it is preferable that all of the memory cells 37 included in each of the memory cell arrays 29 to 32 have the same configuration in view of yield and operating control. However, the memory cells 37 may have different configurations in each memory cell array.

The memory cell 16 having the aforementioned configuration is characterized in that the memory cells 37 included in each of the memory blocks 33 to 36, which are provided in the same column, are connected to the same bit line Bax or Bbx.

According to the aforementioned structure, the memory cells 37 included in the memory blocks 33 to 36 are connected to the same column decoder 21. However, the number of the column decoder 21 is not especially limited, and a plurality of column decoders may be provided if the number of the memory blocks is increased or higher-speed operation is required. For example, one column decoder may be provided for the memory blocks 33 and 35 and another column decoder may be provided for the memory blocks 34 and 36. Alternatively, a column decoder may be provided for each of the memory blocks 33 to 36. In this case, a bit line can be provided independently for each of the memory blocks 33 to 36.

The memory 16 having the aforementioned configuration is also characterized in that the word lines Way, Wby, Wcy, and Wdy (1=y=i, j) are provided independently for each of the memory blocks 33 to 36. Accordingly, the memory blocks 33 to 36 have the row decoders 25 to 28 respectively that operate independently of each other. That is, horizontal scanning of each of the memory blocks 33 to 36 is performed independently of each other.

Figure 11A:
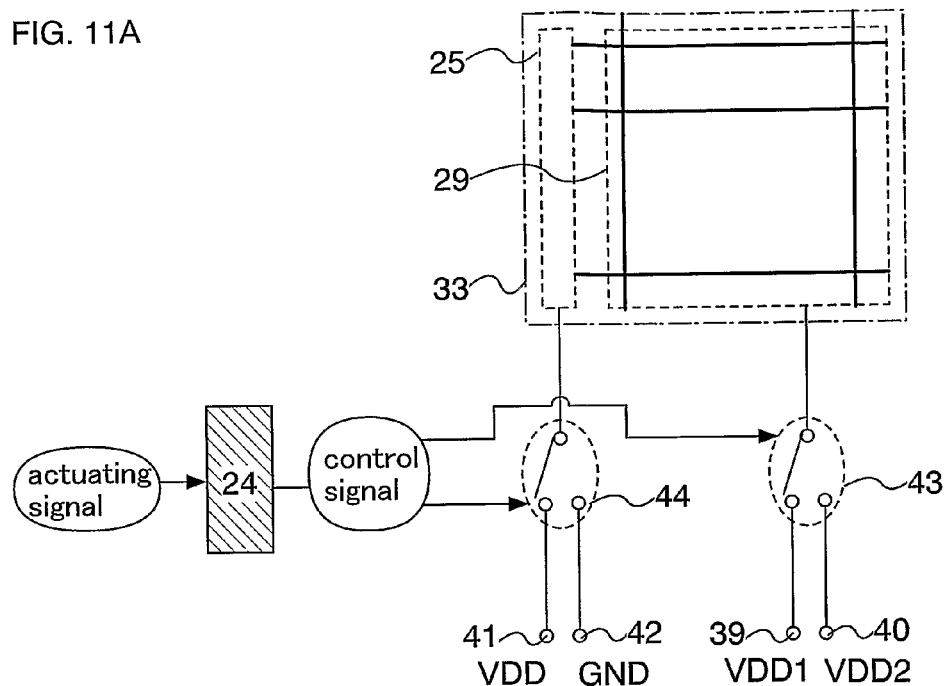
FIGS. 11A and 11B are diagrams showing a semiconductor device of the invention (Embodiment Mode 2).

A memory cell array Y (Y=29 to 32, and Y=29 herein) included in a memory block X (X=33 to 36, and X=33 herein) is connected to power supplies 39 and 40 through a switch 43 (see FIG. 11A). A potential of the power supply 39 (hereinafter also referred to as a first power supply potential or a VDD1) and a potential of the power supply 40 (hereinafter also referred to as a second power supply potential or a VDD2) are set to satisfy VDD1>VDD2. The switch 43 is controlled by a first control signal supplied from the control circuit 24.

A row decoder Z (Z=25 to 28, and Z=25 herein) is connected to power supplies 41 and 42 through a switch 44. A potential of the power supply 41 (hereinafter also referred to as a VDD) and a potential of the power supply 42 (hereinafter also referred to as a GND) are set to satisfy VDD>GND. The switch 44 is controlled by a second control signal supplied from the control circuit 24.

Note that the power supply 39 and the power supply 41 have the same power supply potential in some cases, therefore, they may share a power supply. The potentials of the power supplies 39 to 42 may be either power supply potentials generated in the power supply circuit 11 or power supply potentials generated in a power supply circuit provided in the memory 16.

The control circuit 24 includes a means (function) for supplying a control signal to the memory block X based on an operation signal supplied from the CPU 14, an operation signal supplied from a dedicated circuit provided externally through the reader/writer 19, or an operation signal generated in the memory. The operation signal indicates the mode change (normal mode or standby mode) of the memory block X. The control circuit 24 supplies a control signal to the switches 43 and 44 included in the memory block X in accordance with the operation signal. Thus, the memory block X is set to either the normal mode or the standby mode depending on the connection to the switch 43 or 44.

The data of the operation signal is based on, for example, the result of counting the number of accesses to each memory block for a certain period. More specifically, when the number of accesses to a memory block for a certain period is equal to or less than a predetermined setting value, an operation signal for changing the memory block to the standby mode is outputted. Such counting of the number of accesses to each memory block may be performed by the CPU 14, a dedicated circuit provided externally, or the memory 16 itself.

In the normal mode, the memory block X is electrically connected to the power supply 39 through the switch 43 and electrically connected to the power supply 41 through the switch 44. That is, the VDD1 is supplied to the memory cell array Y while the VDD is supplied to the row decoder Z. Such a state is referred to as (VDD1, VDD).

On the other hand, in the standby mode, the memory block X is: (1) electrically connected to the power supply 39 through the switch 43 and electrically connected to the power supply 42 through the switch 44 (VDD1, GND); (2) electrically connected to the power supply 40 through the switch 43 and electrically connected to the power supply 41 through the switch 44 (VDD2, GND); or (3) electrically connected to the power supply 40 through the switch 43 and electrically connected to the power supply 42 through the switch 44 (VDD2, VDD).

If the memory cell 37 is a volatile memory, data may be erased when a power supply potential supplied to the memory cell array Y is changed. Accordingly, in the case of the memory cell 37 being a volatile memory, the VDD2 is set to a power supply potential at which data is not erased. Meanwhile, if the memory cell 37 is a nonvolatile memory, the VDD2 is set to a ground potential (also referred to as a GND).

Figure 11B:
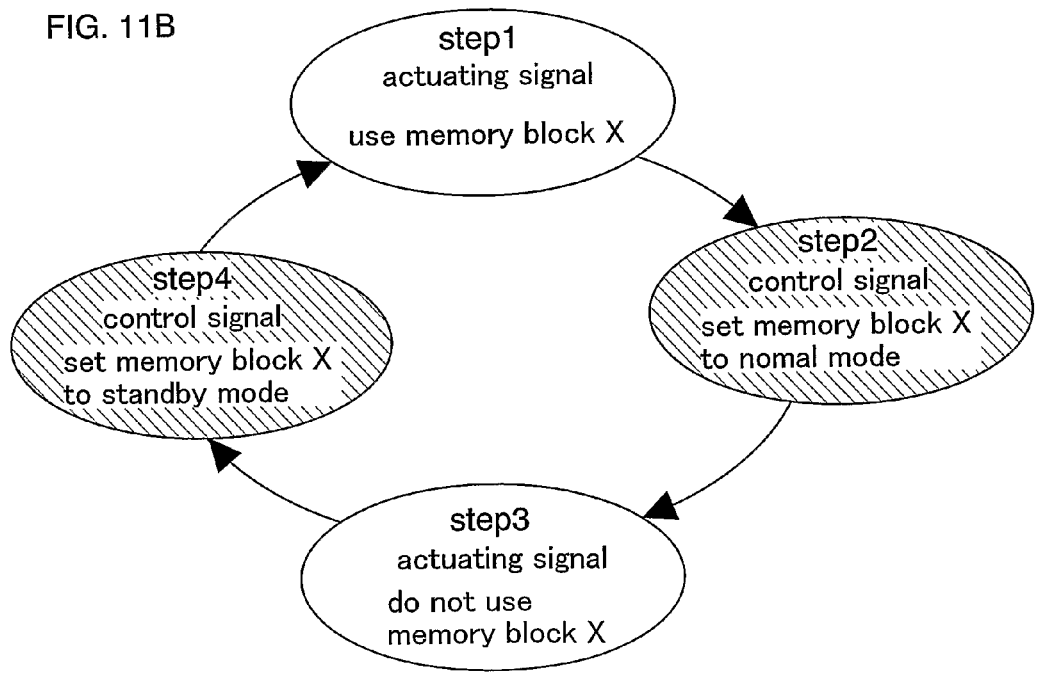

The operation of the memory 16 with the aforementioned configuration can be shown as a chart of FIG. 11B. First, an operation signal is inputted to the control circuit 24. It is assumed herein that the operation signal indicates that the memory block X is used (step 1). Then, the control circuit 24 outputs a control signal for setting the memory block X to the normal mode (step 2).

Subsequently, another operation signal is inputted to the control circuit 24 (step 3). It is assumed herein that the operation signal indicates that the memory block X is not used. Then, the control circuit 24 outputs a control signal for setting the memory block X to the standby mode (step 4). Afterwards, the operation returns to the step 1 and the steps 1 to 4 are repeated.

In this embodiment mode, an optimum power supply potential is selected from a plurality of power supply potentials by controlling the switches 43 and 44 disposed between the memory block X and the power supplies 39 to 42, thereby the mode (normal mode or standby mode) is changed. However, the invention is not limited to this.

For example, an optimum power supply potential may be selected from a plurality of power supply potentials by controlling the power supply circuit 11. According to this method, a plurality of power supply potentials are generated by resistance division in the power supply circuit 11, and the power supply potentials are amplified by an analog buffer and stabilized by a capacitor element, thereby a plurality of power supply potentials are outputted. However, this method requires a controlling switch and a capacitor element, leading to increased circuit area due to such elements. Thus, in order to suppress the increase in circuit area, another method may be adopted in which a plurality of power supply potentials are generated by resistance division in the power supply circuit 11, an optimum power supply potential is selected from the power supply potentials, and the optimum power supply potential is amplified and stabilized, thereby a plurality of power supply potentials are outputted.

When the CPU 14 performs a normal operation using a specific program, only a few data files are accessed in many cases. In such a case, real memories to be accessed are often localized in a relatively narrow space. Therefore, if the accessed real memories are stored in the same memory block, the number of memory blocks that are not used can be increased. In addition, when all of the memory blocks that are not used are set to the standby mode, power consumption can be further reduced. Accordingly, in each of the memory blocks included in the memory 16 of the invention, the addresses are preferably decoded so as to be assigned sequentially.

If the memory block set to the standby mode is accessed, the following two measures can be taken.

According to the first method, a signal including data indicating that the memory block X is in the standby mode and data cannot be read/written is transmitted to an accessing circuit (typically, a CPU). More specifically, a dedicated control signal line is provided between the memory block X and a circuit that might access. If the memory block X in the standby mode is accessed, a dedicated control signal is asserted to interrupt the memory access. At the same time, the accessed memory block X returns to the normal mode, and the interruption is released when the memory block X is ready.

According to the second method, it is ensured that the memory block X is ready. More specifically, the CPU 14 has data on capacitance of the memory block X. The CPU 14 has a means (program or hardware) for checking whether the memory block is in the standby mode or not when accessing each memory block or accessing a memory block different from a memory block that is accessed immediately before. If the memory block X is in the standby mode, memory access instruction is interrupted and the memory block X returns to the normal mode firstly.

As described above, according to the invention, the memory 16 is divided into a plurality of units, namely memory blocks, and power supply to memory blocks that are not used is reduced, leading to low power consumption.

Embodiment 1

Figure 4A:
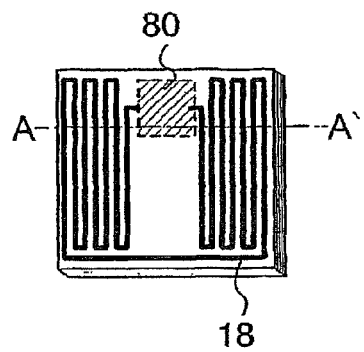
FIGS. 4A to 4D are diagrams showing a semiconductor device of the invention (Embodiment 1).
Figure 4B:
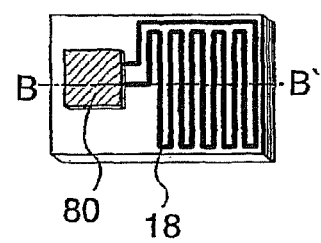
Figure 4C:
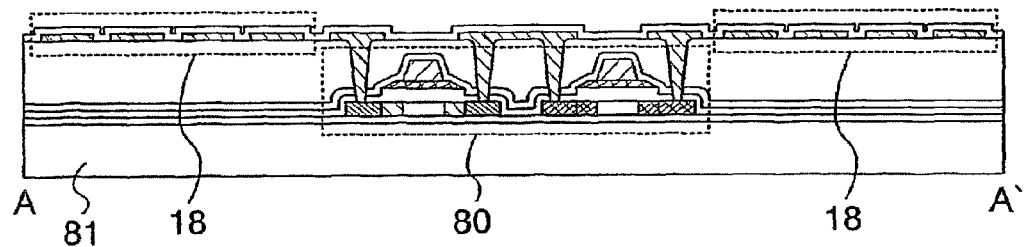
Figure 4D:
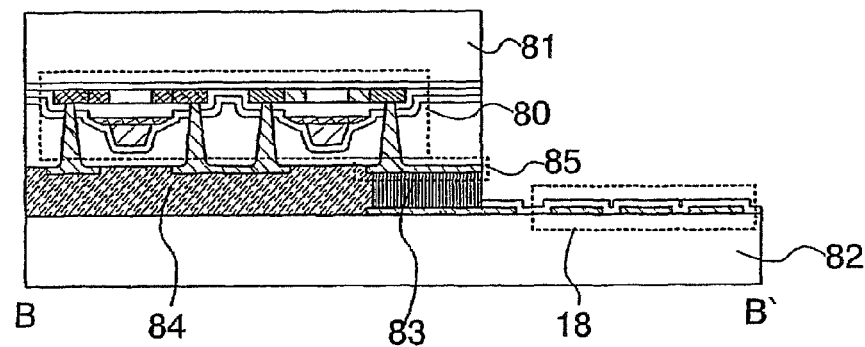

A semiconductor device of the invention is characterized by reading and writing data by wireless. Data transmission system is roughly divided into three types: electromagnetic coupling system where data is communicated by mutual induction with a pair of coils disposed opposite to each other; electromagnetic induction system where data is communicated by the induction field; and radio wave system where data is communicated by radio waves. The invention can be applied to any one of the systems. The antenna 18 for transmitting data may be provided over a substrate 81 on which a plurality of elements are formed (see FIGS. 4A and 4C), or may be provided so as to be connected to a terminal portion that is formed over the substrate 81 on which a plurality of elements are formed (see FIGS. 4B and 4D). In this embodiment, the plurality of elements formed on the substrate 81 are referred to as an element group 80.

In the former case (FIGS. 4A and 4C), the element group 80 and a conductive film functioning as the antenna 18 are formed over the substrate 81. In the shown structure, the conductive film functioning as the antenna 18 is provided on the same layer as a source/drain wiring. However, the invention is not limited to such a structure, and the antenna 18 may be provided on the same layer as a gate electrode or provided on an insulating film formed so as to cover the element group 80.

In the latter case (FIGS. 4B and 4D), the element group 80 and a terminal portion 85 are formed over the substrate 81. In the shown structure, a source/drain wiring of a semiconductor element selected from the element group 80 is used as the terminal portion 85. Then, a substrate 82 on which the antenna 18 is formed is attached to the substrate 81 so as to be connected to the terminal portion 85. An anisotropic conductive paste 83 and a resin 84 are provided between the substrate 81 and the substrate 82.

When the element group 80 is obtained by forming a plurality of element groups 80 over a large substrate and then dividing them, an inexpensive element group can be provided. A quartz substrate, a glass substrate or the like may be used as the substrate at this time, though a glass substrate with no restriction on the area is preferably used.

A plurality of transistors included in the element group 80 may be formed on different layers. When the element group 80 are formed on different layers, an interlayer insulating film is used. The interlayer insulating film may be formed of a resin material such as an epoxy resin, an acrylic resin, and a polyimide resin with light transmissivity, a compound material obtained by polymerizing such as siloxane polymer, a material containing water-soluble homopolymer and water-soluble copolymer, or an inorganic material.

A siloxane compound material is, for example, a material having a backbone structure obtained by binding silicon to oxygen and having at least a hydrogen substituent, or further having one or more substituents selected from fluorine, an alkyl group, and aromatic hydrocarbon in addition to hydrogen. As another material of the interlayer insulating film, a low dielectric constant (low-k) material may be used in order to reduce parasitic capacitance generated between layers. The reduction of parasitic capacitance results in high-speed operation as well as low power consumption.

A plurality of transistors included in the element group 80 may, have an active layer using any one of an amorphous semiconductor, a microcrystalline semiconductor, a polycrystalline semiconductor, and an organic semiconductor. In particular, for obtaining a transistor with excellent properties, an active layer crystallized by using a metal element as a catalyst is preferably used as well as an active layer crystallized by laser irradiation. Alternatively, a semiconductor layer formed by plasma CVD using $SiH_4$ and $F_2$ gas, or $SiH_4$ and $H_2$ gas (+Ar gas), or a layer obtained by irradiating the semiconductor layer with laser may be used as an active layer.

A plurality of transistors included in the element group 80 may have a crystalline semiconductor layer (low temperature polysilicon layer) crystallized at a temperature of 200 to 600° C. (preferably, 350 to 500° C.) or a crystalline semiconductor layer (high temperature polysilicon layer) crystallized at a temperature of 600° C. or more. If a high temperature polysilicon layer is formed over a substrate, a quartz substrate may be used as well as a glass substrate.

It is desirable that hydrogen or halogen be added to an active layer (particularly, a channel forming region) of a transistor included in the element group 80 at a concentration of $1 \times 10^{19}$ to $1 \times 10^{22}$ atoms/cm$^3$, and more preferably $1 \times 10^{19}$ to $5\times10^{20}$ atoms/cm$^3$. According to this, an active layer with few defects, where cracks are not generated easily, can be obtained.

In addition, a barrier film for preventing a contaminant such as an alkaline metal may be provided so as to cover the transistors included in the element group 80 or the element group 80 itself. According to this, the element group 80 that is free from pollution and has improved reliability can be obtained. Note that the barrier film is a silicon nitride film, a silicon nitride oxide film, a silicon oxynitride film, or the like.

The thickness of an active layer of a transistor included in the element group 80 is 20 to 200 nm, preferably 40 to 170 nm, more preferably 45 to 55 nm or 145 to 155 nm, and still more preferably 50 nm or 150 nm. According to this, the element group 80 where cracks are not generated easily even when it is bent can be obtained.

Crystals constituting an active layer of a transistor included in the element group 80 may be formed so that the crystal grain boundary thereof extends parallel to the flowing direction of carriers (channel length direction). Such an active layer may be formed using a continuous wave laser (CWLC) or a pulsed laser operating at a frequency of 10 MHz or more, and preferably 60 to 100 MHz.

A transistor included in the element group 80 may have an S value (subthreshold value) of 0.35 V/decade or less (preferably, 0.09 to 0.25 V/decade) and a mobility of 10 cm$^2$/Vs or more. Such properties can be achieved by forming an active layer using a continuous wave laser or a pulsed laser operating at a frequency of 10 MHz or more.

Further, the element group 80 has the property that the delay time of each gate of a ring oscillator is 1 µsec or less, and preferably 100 nsec or less (at a voltage of 3 to 5 V).

The antenna 18 may be formed by a droplet discharge method using conductive paste containing nanoparticles of gold, silver or copper. The droplet discharge method is a generic term referring to a method of discharging droplets to form a pattern, and includes an ink jet method and a dispenser method. The droplet discharge method has the advantage of improving the usability of materials.

The element group 80 is formed over the substrate 81 such as a glass substrate and a quartz substrate. The element group 80 over the substrate 81 may be used as it is, or may be peeled from the substrate 81 (see FIG. 5A) and then attached to a flexible substrate 86 (see FIG. 5B) in order to produce added value. As the flexible substrate 86 having flexibility, a plastic substrate such as polycarbonate, polyarylate and polyether sulfone, a teflon substrate, a ceramic substrate or the like may be employed.

The element group 80 may be peeled from the substrate 81 by a method of forming a peeling layer between the substrate 81 and the element group 80 and then removing the peeling layer using an etchant; or a method of physically peeling the element group 80 from the substrate 81 after removing a peeling layer partially using an etchant. Note that the physical peeling means peeling by a stress applied externally, for example a stress due to gas pressure sprayed from a nozzle or ultrasonic waves.

The element group 80 may be peeled from the substrate 81 by (1) a method where a metal oxide film is formed between the high heat resistant substrate 81 and the element group 80, and the metal oxide film is weakened by crystallization, thereby the element group 80 is peeled; (2) a method where an amorphous silicon film containing hydrogen is formed between the high heat resistant substrate 81 and the element group 80, and the amorphous silicon film is removed by laser irradiation or etching, thereby the element group 80 is peeled; (3) a method where the high heat resistant substrate 81 on which the element group 80 is formed is removed mechanically or by etching using a solution or a gas such as ClF$_3$, thereby the element group 80 is peeled; and the like. The peeled element group 80 can be attached to the flexible substrate 86 with a commercial adhesive such as an epoxy resin adhesive, an adhesive using a resin additive and the like.

As set forth above, by attaching the element group 80 to the flexible substrate 86, a thin, light and highly impact-resistant semiconductor device can be provided (see FIG. 5C). In addition, when an inexpensive substrate is used as the flexible substrate 86, an inexpensive semiconductor device can be obtained. Further, since the flexible substrate 86 has flexibility, it can be attached to a curved surface or an irregular shaped surface, leading to various applications. For example, a wireless tag 20 that is one mode of the semiconductor device of the invention can be attached close to a curved surface such as a medicine bottle (see FIG. 5D). If the substrate 81 is reused, a lower cost of the semiconductor device is achieved. This embodiment can be implemented in combination with the aforementioned embodiment modes and embodiments.

Embodiment 2

Figure 8A:
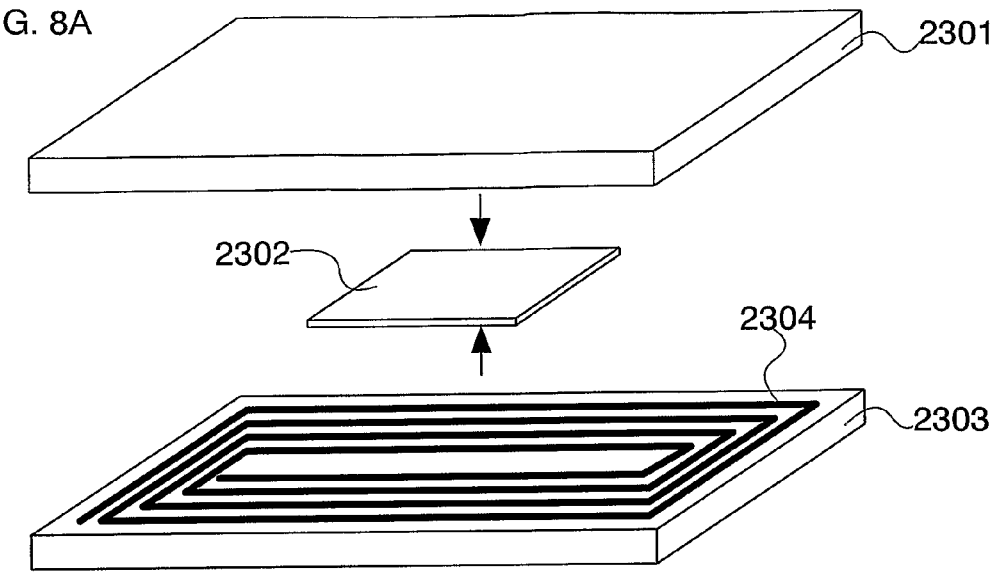
FIGS. 8A to 8C are diagrams showing applications of a semiconductor device of the invention (Embodiment 2).

In this embodiment, a flexible wireless tag formed by a peeling process is described (see FIG. 8A). A wireless tag includes a flexible protective layer 2301, a flexible protective layer 2303 having an antenna 2304, and an element group 2302 formed by a peeling process. The antenna 2304 formed on the protective layer 2303 is electrically connected to the element group 2302. Although the antenna 2304 is formed only on the protective layer 2303 in the drawing, the invention is not limited to this and the antenna 2304 may be additionally formed on the protective layer 2301. Note that a barrier film is preferably formed between the element group 2302 and the protective layers 2301 and 2303 by using a silicon nitride film and the like. According to this, the element group 2303 is free from pollution, and thus a wireless tag with improved reliability can be provided.

The antenna 2304 is desirably formed of silver, copper, or metal coated with them. The antenna 2304 is connected to the element group 2302 by UV treatment or ultrasonic treatment using an anisotropic conductive film, though the invention is not limited to this connecting method and various methods can be adopted.

Figure 8B:
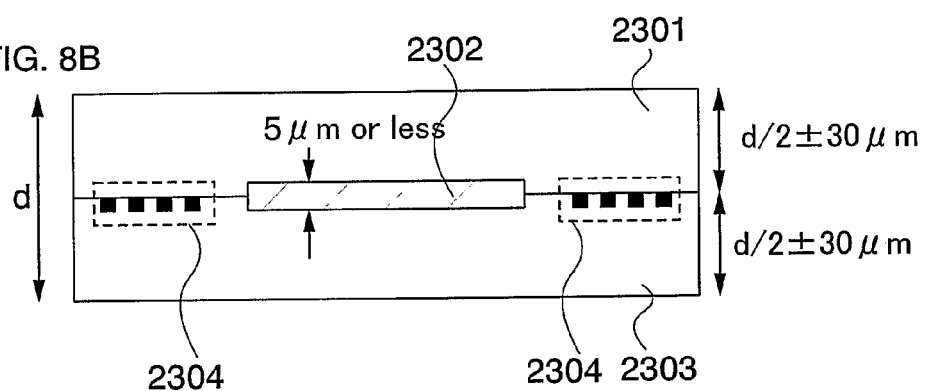

The element group 2302 sandwiched between the protective layers 2301 and 2303 has a thickness of 5 µm or less, and preferably a thickness of 0.1 to 3 µm (see FIG. 8B showing a cross sectional structure). The respective thicknesses of the flexible protective layers 2301 and 2303 are desirably set to be (d/2)±30 µm, and more preferably (d/2)±10 µm, provided that the total thickness thereof is d. It is also desirable that the protective layers 2301 and 2303 each have a thickness of 10 to 200 µm. The area of the element group 2302 is 5 mm square (25 mm$^2$) or less, and preferably 0.3 to 4 mm square (0.09 to 16 mm$^2$).

The protective layers 2301 and 2303, which are formed of an organic resin material, have a structure resistant to bending. The element group 2302 itself formed by a peeling process is also resistant to bending as compared with a single crystalline semiconductor. Thus, the element group 2302 can be attached close to the protective layers 2301 and 2303 without any space therebetween. Therefore, a completed wireless tag itself can have a structure resistant to bending. Such an element group 2302 sandwiched between the protective layers 2301 and 2303 may be disposed on a surface of or inside an object, or mounted inside a piece of paper.

Figure 8C:
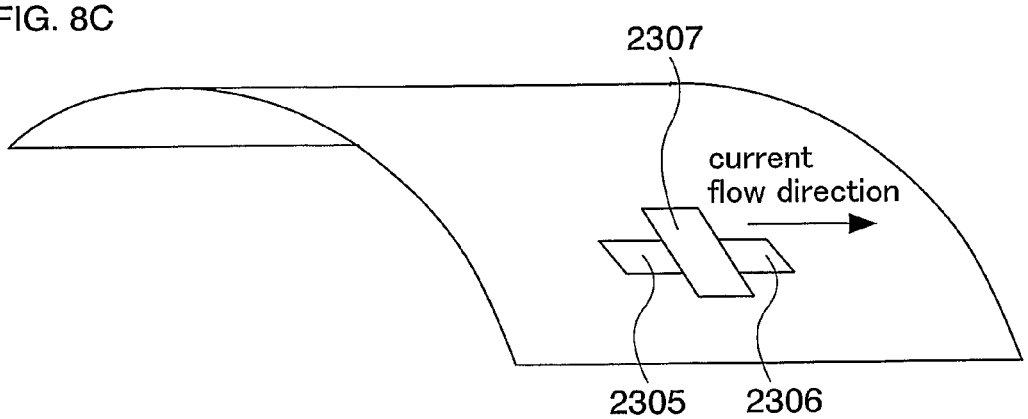

Described now is the case of attaching an element group formed by a peeling process to a substrate having a curved surface (see FIG. 8C). FIG. 8C shows one transistor selected from the element group formed by a peeling process. This transistor is arranged so that the direction of an arc drawn by the substrate is perpendicular to that of current flowing. According to such a structure, it is possible to reduce the effect of stress and suppress variations in characteristics of transistors included in the element group even when the substrate is bent to draw an arc.

In addition, in order to prevent an active element such as a transistor from being damaged due to stress, it is desirable that an active region (silicon island portion) of the active element occupy 5 to 50% (preferably, 5 to 30%) of the whole area of the substrate. A region where no active element such as a TFT is provided mainly includes a base insulating film material, an interlayer insulating film material and a wiring material. It is desirable that a region other than the active region of a transistor and the like occupy 60% or more of the whole area of the substrate. According to such a structure, a highly integrated semiconductor device that is easily bent can be provided.

Embodiment 3

Figure 6A:
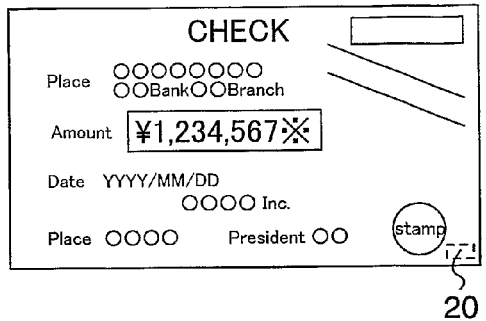
FIGS. 6A to 6H are diagrams showing applications of a semiconductor device of the invention (Embodiment 3).
Figure 6B:
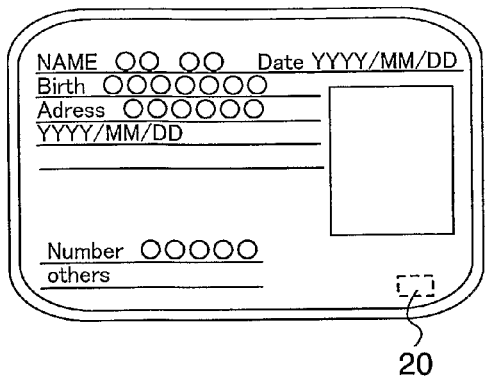
Figure 6C:
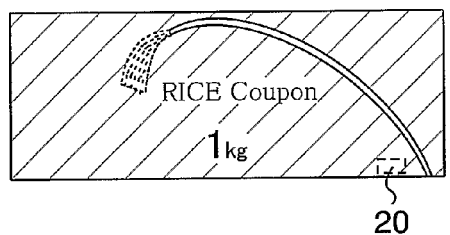
Figure 6D:
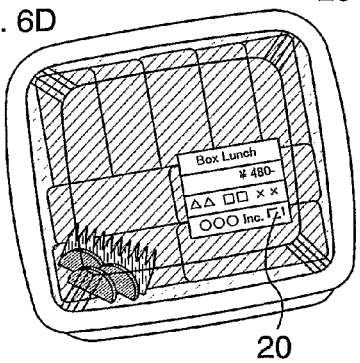
Figure 6E:
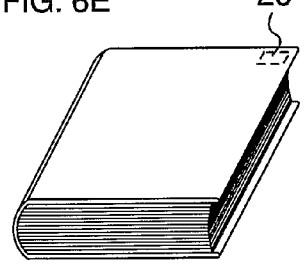
Figure 6F:
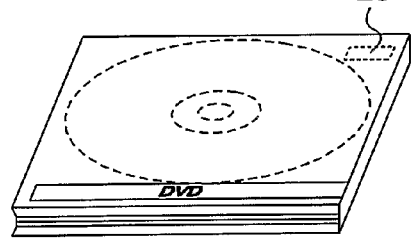
Figure 6G:
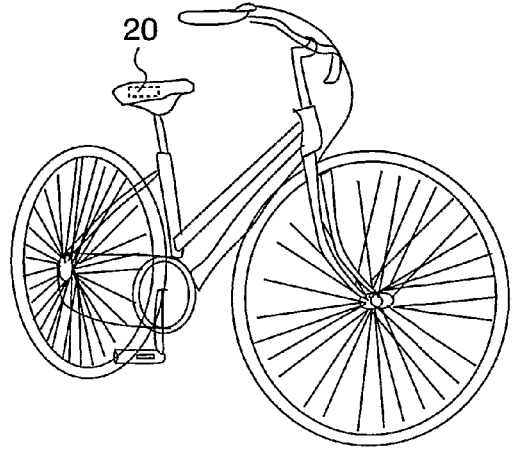
Figure 6H:
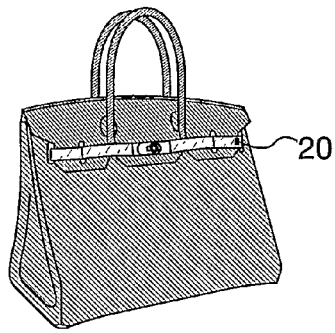

The semiconductor device of the invention can be applied to various fields. For example, a wireless tag that is one mode of the semiconductor device of the invention can be mounted on bills, coins, securities, certificates, bearer bonds, packing containers, books, a recording medium, personal items, vehicles, food items, garments, healthcare items, livingwares, medicals, an electronic apparatus, and the like. The bills and the coins refer to currency in the market and include a note that is a currency in a specific area (cash voucher), memorial coins and the like. The securities refer to a check, a stock certificate, a promissory note, and the like (see FIG. 6A). The certificates include a driver's license, a resident card and the like (see FIG. 6B). The bearer bonds refer to a stamp, various gift coupons and the like (see FIG. 6C). The packing containers refer to a wrapping paper of a lunch box or the like, a plastic bottle and the like (see FIG. 6D). The books refer to a book, a volume and the like (see FIG. 6E). The recording medium refers to DVD software, a video tape and the like (see FIG. 6F). The personal items refer to a bag, glasses and the like (see FIG. 6H). The vehicles refer to a wheeled vehicle such as a bicycle, a vessel and the like (see FIG. 6G). The food items refer to foods, beverages and the like. The garments refer to clothing, footwear and the like. The healthcare items refer to medical devices, health appliances and the like. The livingwares refer to furniture, a lighting apparatus and the like. The medicals refer to medicines, agricultural chemicals and the like. The electronic apparatus refers to a liquid crystal display device, an EL display device, a TV receiver (a TV set, a flat screen TV receiver, and a flat screen TV set), a mobile phone, and the like. When a wireless tag is mounted on the bills, the coins, the securities, the certificates, the bearer bonds, and the like, counterfeiting thereof can be prevented. When a wireless tag is mounted on the packing containers, the books, the recording medium, the personal items, the food items, the livingwares, the electronic apparatus, and the like, the efficiency of the inspection system, the rental system and the like can be improved. When a wireless tag is mounted on the vehicles, the healthcare items, the medicals and the like, counterfeiting and theft thereof can be prevented and the medicines can be prevented from being consumed in the wrong manner. The wireless tag may be attached to a surface of a product or mounted inside a product. For example, the wireless tag may be mounted inside a page of a book, or an organic resin of a package.

Figure 7A:
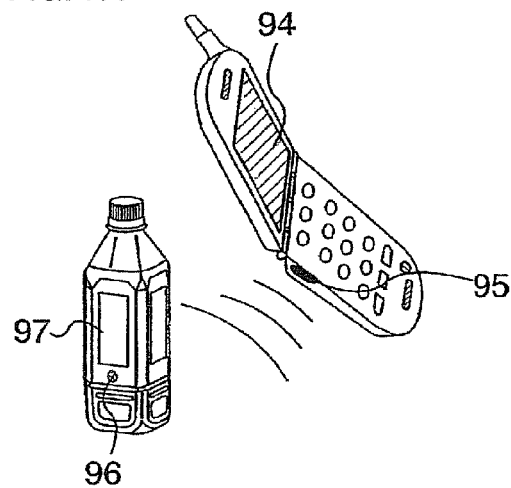
FIGS. 7A and 7B are diagrams showing applications of a semiconductor device of the invention (Embodiment 3).
Figure 7B:
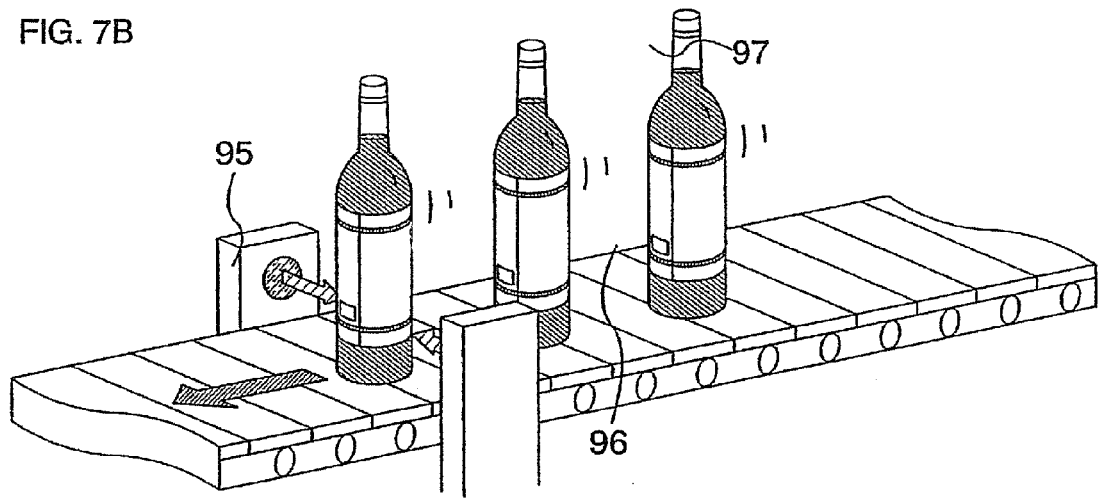

When the invention is thus applied to product management and distribution system, high performance system can be achieved. For example, a reader/writer 95 can be provided on the side of a portable terminal including a display portion 94 while a wireless tag 96 that is one mode of the semiconductor device of the invention can be provided on the side of a product 97 (see FIG. 7A). In this case, when the wireless tag 96 is put close to the reader/writer 95, the display portion 94 displays data on the product 97 such as ingredients, a place of origin, and a record of the distribution process. Conventionally, the data on the product 97 was limited to the one shown on a label. Meanwhile, a larger amount of data can be obtained by providing the wireless tag 96. As another example, the reader/writer 95 can be provided beside a conveyor belt (see FIG. 7B). In such a case, the product 97 can be inspected easily. This embodiment can be implemented in combination with the aforementioned embodiment modes and embodiments.

EXPLANATION OF REFERENCE

11: power source circuit 12: clock generation circuit 13: data demodulation/modulation circuit 14: CPU 15: interface circuit 16: memory 17: data bus 18: antenna 19: reader/writer 20: wireless tag 21: column decoder 22: selector 23: read/write circuit 24: control circuit 25: row decoder 26: row decoder 27: row decoder 28: row decoder 29: memory cell array 30: memory cell array 31: memory cell array 32: memory cell array 33: memory block 34: memory block 35: memory block 36: memory block 39: power source 40: power source 41: power source 42: power source 43: switch 44: switch 51: bus interface 52: data cache 53: instruction decoder 54: reservation station 55: instruction cache 56: ALU 57: ALU 58: FPU 59: FPU 60: branch unit 61: load/store unit 62: pipeline unit 63: general purpose register 64: CPU core 65: control circuit 67: peripheral memory controller 68: peripheral memory controller 69: peripheral bus controller 70: peripheral controller 71: power source 72: power, source 73: power source 74: switch 75: switch 80: element group 81: substrate 82: substrate 83: conductive particle 84: resin 85: terminal portion 86: substrate 94: display portion 95: reader/writer 96: wireless tag 97: product 601: power source generation circuit 602: power source generation circuit 603: resistor element 604: reference potential generation circuit 605: comparator circuit 2301: protective layer 2302: element group 2303: protective layer 2304: antenna 2305: drain electrode 2306: source electrode 2307: gate electrode

What is claimed is:

1. A semiconductor device comprising:
   a CPU comprising an unit;
   a power source circuit configured to supply a first potential and a second potential;
   a control circuit operationally connected to the CPU;
   a memory block comprising a memory cell array;
   a first switch configured to selectively supply the unit with one of the first potential and the second potential in accordance with a first control signal from the control circuit; and
   a second switch configured to selectively supply the memory cell array with one of the first potential and the second potential in accordance with a second control signal from the control circuit.

2. The semiconductor device according to claim 1, further comprising a third switch, wherein the memory block further comprises a decoder, and wherein the third switch is configured to selectively supply the decoder with one of the first potential and the second potential in accordance with a third control signal from the control circuit.

3. The semiconductor device according to claim 1, further comprising a dedicated circuit configured to output an operation signal to the control circuit.

4. The semiconductor device according to claim 1, wherein the control circuit is configured to output the first control signal in accordance with an event signal supplied from the unit.

5. The semiconductor device according to claim 1, wherein the control circuit is configured to output the second control signal and to set the memory block to a normal mode or a standby mode.

6. The semiconductor device according to claim 1, wherein the unit is one of a bus interface, a data cache, an instruction decoder, a reservation station, an instruction cache, a pipeline register including an arithmetic logical unit, and a general purpose register.

7. A semiconductor device comprising:
a first unit;
a second unit;
a power source circuit configured to supply a first potential and a second potential;
a control circuit;
a memory block comprising a memory cell array;
a first switch configured to selectively supply the first unit with one of the first potential and the second potential in accordance with a first control signal from the control circuit;
a second switch configured to selectively supply the second unit with one of the first potential and the second potential in accordance with a second control signal from the control circuit; and
a third switch configured to selectively supply the memory block with one of the first potential and the second potential in accordance with a third control signal from the control circuit.

8. The semiconductor device according to claim 7, further comprising a CPU operationally connected to the control circuit,
wherein the CPU comprises the first unit and the second unit.

9. The semiconductor device according to claim 7, further comprising a fourth switch,
wherein the memory block further comprises a decoder, and
wherein the fourth switch is configured to selectively supply the decoder with one of the first potential and the second potential in accordance with a fourth control signal from the control circuit.

10. The semiconductor device according to claim 7, further comprising a dedicated circuit configured to output an operation signal to the control circuit.

11. The semiconductor device according to claim 7, wherein the control circuit is configured to output the first control signal in accordance with an event signal supplied from the first unit.

12. The semiconductor device according to claim 7, wherein the control circuit is configured to output the third control signal and to set the memory block to a normal mode or a standby mode.

13. The semiconductor device according to claim 7, wherein each of the first unit and the second unit is one of a bus interface, a data cache, an instruction decoder, a reservation station, an instruction cache, a pipeline register including an arithmetic logical unit, and a general purpose register.

14. A semiconductor device comprising:
an unit;
a power source circuit configured to supply a first potential and a second potential;
a control circuit;
a first memory block comprising a first memory cell array and a first row decoder;
a second memory block comprising a second memory cell array and a second row decoder;
a column decoder operationally connected to the first memory block and the second memory block;
a first switch configured to selectively supply the unit with one of the first potential and the second potential in accordance with a first control signal from the control circuit;
a second switch configured to selectively supply the first memory block with one of the first potential and the second potential in accordance with a second control signal from the control circuit; and
a third switch configured to selectively supply the second memory block with one of the first potential and the second potential in accordance with a third control signal from the control circuit.

15. The semiconductor device according to claim 14, further comprising a CPU operationally connected to the control circuit,
wherein the CPU comprises the unit.

16. The semiconductor device according to claim 14, further comprising a fourth switch and a fifth switch,
wherein the fourth switch is configured to selectively supply the first row decoder with one of the first potential and the second potential in accordance with a fourth control signal from the control circuit, and
wherein the fifth switch is configured to selectively supply the second row decoder with one of the first potential and the second potential in accordance with a fifth control signal from the control circuit.

17. The semiconductor device according to claim 14, further comprising a dedicated circuit configured to output an operation signal to the control circuit.

18. The semiconductor device according to claim 14, wherein the control circuit is configured to output the first control signal in accordance with an event signal supplied from the unit.

19. The semiconductor device according to claim 14, wherein the control circuit is configured to output the second control signal and to set the first memory block to a normal mode or a standby mode.

20. The semiconductor device according to claim 14, wherein the unit is one of a bus interface, a data cache, an instruction decoder, a reservation station, an instruction cache, a pipeline register including an arithmetic logical unit, and a general purpose register.

* * * * *